(12) United States Patent
Kuyel (10) Patent No.: US 12,195,850 B2
(45) Date of Patent: Jan. 14, 2025

(54) APPARATUS AND METHODS FOR ROLL-TO-ROLL (R2R) PLASMA ENHANCED/ACTIVATED ATOMIC LAYER DEPOSITION (PEALD/PAALD)

(71) Applicant: Nano-Master, Inc., Austin, TX (US)

(72) Inventor: Birol Kuyel, Austin, TX (US)

(73) Assignee: Nano-Master, Inc., Austin, TX (US)

( * ) Notice: Subject to any disclaimer, the term of this patent is extended or adjusted under 35 U.S.C. 154(b) by 0 days.

(21) Appl. No.: 17/679,306

(22) Filed: Feb. 24, 2022

(65) Prior Publication Data

US 2023/0047633 A1 Feb. 16, 2023

Related U.S. Application Data

(62) Division of application No. 17/402,205, filed on Aug. 13, 2021.

(51) Int. Cl.
*H01L 21/00* (2006.01)
*C23C 16/00* (2006.01)
(Continued)

(52) U.S. Cl.
CPC ...... *C23C 16/45536* (2013.01); *C23C 16/482* (2013.01); *C23C 16/545* (2013.01);
(Continued)

(58) Field of Classification Search
None
See application file for complete search history.

(56) References Cited

U.S. PATENT DOCUMENTS 3,906,133 A 9/1975 Flutie
4,282,267 A 8/1981 Kuyel
(Continued)

FOREIGN PATENT DOCUMENTS

EP 3822389 A1 * 5/2021 ............ C23C 16/04
WO WO-2017125672 A1 * 7/2017

OTHER PUBLICATIONS

Ali et al, "Low-Temperature Roll-to-Roll Atmospheric Atomic Layer Deposition of Al2O3 Thin Films", American Chemical Society (ACS) Publications (dx.doi.org/10.1021/la503406v), Nov. 19, 2014, pp. 14195-14203, vol. 30, Issue 47, Langmuir—ACS Publishing Center, Washington, DC, USA.
(Continued)

*Primary Examiner* — Sylvia MacArthur
*Assistant Examiner* — Michelle Crowell
(74) *Attorney, Agent, or Firm* — Asif Ghias (57) ABSTRACT

Techniques are disclosed for roll-to-roll (R2R) atomic layer deposition (ALD). R2R ALD is accomplished by arranging precursor nozzles in A/B pairs while a flexible web substrate moves underneath the A/B pairs at a uniform speed. Nozzles A of the A/B pairs continuously flow a precursor A into the process volume of the R2R ALD chamber. The plasma enhanced/activated ALD (PEALD/PAALD) embodiments utilize electron cyclotron resonance or rotation (ECR)-enhanced hollow cathode plasma sources (HCPS) where nozzles B flow activated neutrals of precursor B into the process volume. As the flexible web moves in an R2R motion, nucleates from precursor A deposited on the surface of the substrate, and neutrals of precursor B undergo a self-limiting reaction to deposit a single atomically sized ALD film/layer. In this manner, multiple ALD layers may be deposited by each successive A/B pair in a single pass of the web. There is also a heat source underneath the web to further facilitate the ALD reaction, or to support thermal ALD embodiments.

10 Claims, 4 Drawing Sheets

(51) Int. Cl.
*C23C 16/455* (2006.01)
*C23C 16/48* (2006.01)
*C23C 16/54* (2006.01)
*H01J 37/32* (2006.01)

(52) U.S. Cl.
CPC .. *H01J 37/32082* (2013.01); *H01J 37/32596* (2013.01); *H01J 37/3277* (2013.01)

(56) References Cited

U.S. PATENT DOCUMENTS

| | | | |
|---|---|---|---|
| 4,537,813 | A | 8/1985 | Kuyel |
| 5,332,442 | A | 7/1994 | Kubodera et al. |
| 5,571,366 | A | 11/1996 | Ishii et al. |
| 6,190,743 | B1 | 2/2001 | Wang |
| 6,863,021 | B2 | 5/2005 | Sneh |
| 6,916,398 | B2 | 7/2005 | Chen et al. |
| 6,998,014 | B2 | 2/2006 | Chen et al. |
| 7,138,336 | B2 | 11/2006 | Lee et al. |
| 7,314,667 | B2 | 1/2008 | Tregub et al. |
| 7,314,835 | B2 | 1/2008 | Ishizaka et al. |
| 7,341,959 | B2 | 3/2008 | Brcka |
| 7,780,785 | B2 | 8/2010 | Chen et al. |
| 7,851,380 | B2 | 12/2010 | Nelson et al. |
| 7,966,969 | B2 | 6/2011 | Hasper et al. |
| 8,187,679 | B2 | 5/2012 | Dickey et al. |
| 8,192,903 | B2 | 6/2012 | Wang |
| 8,304,019 | B1 | 11/2012 | Pichler |
| 8,637,117 | B2 | 1/2014 | Dickey et al. |
| 8,637,411 | B2 | 1/2014 | Swaminathan et al. |
| 8,728,955 | B2 | 5/2014 | LaVoie et al. |
| 8,900,403 | B2 * | 12/2014 | Holland ............ H01J 37/32082 156/345.48 |
| 8,940,646 | B1 | 1/2015 | Chandrasekharan et al. |
| 9,343,296 | B2 | 5/2016 | LaVoie |
| 9,469,901 | B2 | 10/2016 | Dickey et al. |
| 9,598,769 | B2 * | 3/2017 | Elam ...................... H10K 71/00 |
| 9,708,710 | B2 | 7/2017 | Alasaarela et al. |
| 9,745,661 | B2 | 8/2017 | Malinen et al. |
| 9,972,501 | B1 | 5/2018 | Kuyel |
| 10,214,813 | B2 | 2/2019 | Keto |
| 10,361,088 | B2 | 7/2019 | Kuyel |
| 10,366,898 | B2 | 7/2019 | Kuyel |
| 10,435,788 | B2 | 10/2019 | Spath et al. |
| 10,685,817 | B2 | 6/2020 | Kon |
| 10,916,672 | B2 | 2/2021 | Compaan et al. |
| 2002/0047541 | A1 * | 4/2002 | Okumura ............ H01J 37/3244 315/111.21 |
| 2002/0129769 | A1 | 9/2002 | Kim et al. |
| 2007/0080387 | A1 | 4/2007 | Liu et al. |
| 2007/0116887 | A1 * | 5/2007 | Faguet .................. C23C 16/515 700/121 |
| 2007/0281089 | A1 | 12/2007 | Heller et al. |
| 2008/0110400 | A1 | 5/2008 | Satou et al. |
| 2009/0075179 | A1 | 3/2009 | Ultanir et al. |
| 2010/0221426 | A1 * | 9/2010 | Sferlazzo .......... C23C 16/45551 118/724 |
| 2011/0003087 | A1 | 1/2011 | Soininen et al. |
| 2012/0132366 | A1 * | 5/2012 | Wu ..................... H01J 37/3244 156/345.44 |
| 2012/0141676 | A1 | 6/2012 | Sershen et al. |
| 2012/0269968 | A1 | 10/2012 | Rayner |
| 2013/0113085 | A1 * | 5/2013 | Michaelson .......... C23C 16/405 438/785 |
| 2013/0251916 | A1 | 9/2013 | Krueger et al. |
| 2014/0020627 | A1 | 1/2014 | Kano et al. |
| 2014/0216337 | A1 | 8/2014 | Swaminathan et al. |
| 2014/0231930 | A1 * | 8/2014 | Weidman .......... H01L 21/28562 438/785 |
| 2014/0366804 | A1 | 12/2014 | Pak et al. |
| 2015/0104736 | A1 | 4/2015 | Hsu et al. |
| 2015/0167167 | A1 | 6/2015 | Vermeer et al. |
| 2015/0184289 | A1 * | 7/2015 | Lee ........................ C23C 16/52 118/710 |
| 2015/0376785 | A1 | 12/2015 | Knaapen et al. |
| 2016/0052655 | A1 | 2/2016 | Nguyen et al. |
| 2016/0060758 | A1 * | 3/2016 | Marquardt ........ C23C 16/45553 427/255.35 |
| 2016/0079056 | A1 | 3/2016 | Harada et al. |
| 2016/0293386 | A1 * | 10/2016 | Chen ................. H01J 37/32467 |
| 2016/0312360 | A1 | 10/2016 | Rasheed et al. |
| 2016/0342079 | A1 | 11/2016 | Oh et al. |
| 2017/0002463 | A1 | 1/2017 | Fan et al. |
| 2017/0016114 | A1 | 1/2017 | Becker et al. |
| 2018/0025892 | A1 | 1/2018 | Biquet et al. |
| 2018/0277400 | A1 * | 9/2018 | Aiso ................... H01L 21/6719 |
| 2019/0115409 | A1 * | 4/2019 | Huh ...................... C23C 16/515 |
| 2019/0384163 | A1 | 12/2019 | Kim et al. |
| 2020/0150527 | A1 | 5/2020 | Chen et al. |
| 2020/0161132 | A1 | 5/2020 | Chen et al. |
| 2020/0385885 | A1 * | 12/2020 | Hsieh ................. C23C 16/45551 |
| 2021/0249234 | A1 * | 8/2021 | Kuyel ............... H01J 37/32596 |
| 2021/0351072 | A1 * | 11/2021 | Chen ................. H01L 21/28556 |

OTHER PUBLICATIONS

Beneq, "Advanced tool for advanced ALD research: Thin Film System—TFS 200", Beneq, Jul. 1, 2009, 28 pgs.
Dickey et al, "High rate roll to roll atomic layer deposition, and its application to moisture barriers on polymer films", Journal of Vacuum Science & Technology A: Vacuum, Surfaces, and Films, Jan. 24, 2012, pp. 021502-1 through 021502-5, vol. 30, No. 2, American Institute of Physics, College Park, MD, USA.
Dimitrakellis et al., "Development of a hollow cathode plasma source for microcrystalline silicon thin films deposition", Journal of Physics, 11th European Conference on High-Technology Plasma Processes, Apr. 18, 2011, pp. 012014, vol. 275, IOP Publishing, Bristol, UK.
Fietzke et al., "Magnetically enhanced hollow cathode—a new plasma source for high-rate deposition processes", Plasma Processes and Polymers, Nov. 20, 2009, pp. S242-S246, vol. 6, Wiley-VCH Verlag Gmbh & Co. KGaA, Weinheim, Germany.
Han, "Physical Processes in Hollow Cathode Discharge", Theses, Master of Science in Physics, Dec. 1, 1989, pp. 1-61, Naval Postgraduate School, Monterey, CA, USA.
Hossbach, C. et al., "Overview of ALD equipment and technologies", ALD for Industry 2017, EFDS Workshop, Institute of Semiconductors and Microsystems—Technical University of Dresden, Jan. 17, 2017, 47 pgs.
Kaariainen, Tommi O. et al., "Plasma-Assisted Atomic Layer Deposition of Al2O3 at Room Temperature", Plasma Processes and Polymers, Wiley Inter-Science, Jun. 2009, pp. 237-241.
Lotus, "TransFlex-ALD", Lotus Applied Technology, Jul. 14, 2021, pp. 1-5, Beaverton, OR, USA.
Poodt et al, "Low temperature and roll-to-roll spatial Atomic Layer Deposition for flexible electronics", Journal of Vacuum Science and Technology A: Vacuum, Surfaces, and Films (https://doi.org/10.1116/1.3667113), Dec. 9, 2011, vol. 30, Issue 1, American Institute of Physics, College Park, MD, USA.
Standing, A.J., "Nanowire solar water splitting", Technische Universiteit Eindhoven, Thesis—Applied Physics, Jan. 6, 2016, 170 pgs.

* cited by examiner

APPARATUS AND METHODS FOR ROLL-TO-ROLL (R2R) PLASMA ENHANCED/ACTIVATED ATOMIC LAYER DEPOSITION (PEALD/PAALD)

CROSS-REFERENCE TO RELATED APPLICATIONS

This application is a divisional of and claims priority from U.S. patent application Ser. No. 17/402,205 filed on Aug. 13, 2021 and which is incorporated by reference for all purposes herein in its entirety.

This application is also related to U.S. patent application Ser. No. 17/162,828 filed on Jan. 29, 2021 and U.S. patent application Ser. No. 16/738,240 filed on Jan. 9, 2020. This application is further related to U.S. patent application Ser. No. 15/950,330 filed on 11 Apr. 2018, now U.S. Pat. No. 10,366,898 B2 issued on Jul. 30, 2019. This application is also related to U.S. patent application Ser. No. 15/950,391 also filed on 11 Apr. 2018, now U.S. Pat. No. 10,361,088 B2 issued on Jul. 23, 2019. This application is also related to U.S. patent application Ser. No. 15/458,642, now U.S. Pat. No. 9,972,501 B1 issued on 15 May 2018.

All the above numbered U.S. Patents and U.S. Patent Applications are incorporated by reference herein for all purposes in their entireties.

FIELD OF THE INVENTION

This invention relates generally to atomic layer deposition (ALD) and more specifically to roll-to-roll (R2R) atomic layer deposition (ALD).

BACKGROUND OF THE INVENTION

Atomic layer deposition (ALD) is a special type of chemical vapor deposition (CVD) technique. ALD utilizes a sequential exposure of gaseous reactants for the deposition of atomically sized thin films. The reactants are often metal precursors consisting of organometallic liquids or solids used in the chemistry by vaporizing under vacuum and/or heat conditions. The reactants are introduced as a series of sequential, non-overlapping pulses. In each of these pulses, the reactant molecules react with a substrate or wafer surface in a self-limiting way. Consequently, the reaction ceases once all the reactive sites on the wafer/substrate surface are consumed. Between the two pulses, a purge step is applied to remove the excess reactants and byproducts from the process chamber. Using ALD, it is possible to grow materials uniformly and with high precision on arbitrarily complex and large substrates. Some examples of films produced using ALD are $SiO_2$, $Si_3N_4$, $Ga_2O_3$, $GaN$, $Al_2O_3$, $AlN$, etc.

Several techniques are employed in ALD in order to improve economical efficiencies and throughput. In a roll-to-roll (R2R) configuration, film formation is performed on a flexible substrate or web while the substrate is rolled out from a roll, moved/transported, and then rolled onto another roll.

There are many different techniques for performing R2R ALD in the prior art. U.S. Pat. No. 8,304,019 B1 to Pichler teaches an R2R ALD system in which a portion of a flexible web/substrate from a first roll is disposed in a chamber. A first atomic layer deposition (ALD) half-reaction is performed on the portion of the substrate while the portion is within the chamber. A subsequent ALD half reaction can be performed on the same portion of the substrate to form a layer of material. Multiple ALD sequences may be performed by passing the substrate through a sequence of ALD reaction chambers or by passing the substrate through one or more ALD reaction chambers in a continuous loop.

U.S. Pat. No. 9,469,901 B2 to Dickey et al. discloses Systems and methods for atomic layer deposition (ALD) on a flexible substrate. The process involves guiding the substrate back and forth between spaced-apart first and second precursor zones and through a third precursor zone interposed between the first and second precursor zones, so that the substrate transits through each of the precursor zones multiple times. Systems may include a series of turning guides spaced apart along the first and second precursor zones for supporting the substrate along an undulating transport path. The substrate traverses back and forth between the first and second precursor zones and through the third precursor zone. As it does so, it passes through a first series of flow-restricting passageways of a first isolation region interposed between the first and third precursor zones and a second series of flow-restricting passageways of a second isolation region interposed between the second and third precursor zones.

U.S. Pat. No. 9,598,769 B2 to Elam et al. teaches a system and method for continuous ALD as a part of R2R ALD. The system and method include a housing, a moving bed which passes through the housing and a plurality of precursor gases. The reference also teaches associated input ports and the amount of precursor gases, position of the input ports, and relative velocity of the moving bed and carrier gases enabling exhaustion of the precursor gases at available reaction sites.

U.S. Pat. No. 10,435,788 B2 to Spath et al. discloses a material deposition system for depositing a material on a surface of a substrate. The system includes a deposition head having an output face configured to simultaneously supply a plurality of gaseous materials in a sequence of gas zones. The gas zones include a deposition zone located between first and second inert zones. The deposition zone includes a first reactant zone adjacent to the first inert zone, a last reactant zone adjacent to the second inert zone, and one or more purge gas zones.

A motion actuator moves a substrate over the output face with a repeating motion profile that prevents a region of active deposition on the substrate from being exposed to the external environment prior to having achieved a final material deposition amount. The repeating motion profile include a forward motion portion and a backward motion portion which is less than the forward distance by an "ooch" distance. The ooch distance refers to the difference between the forward motion portion and the backward motion portion.

The article entitled "High rate roll to roll atomic layer deposition, and its application to moisture barriers on polymer films" by Dickey et al. of Lotus Applied Technology, published in the Journal of Vacuum Science and Technology on 24 Jan. 2012, argues that ALD has been shown to provide high quality single layer moisture barrier films on polymer substrates, but conventional pulse-based processes are too slow to be commercially feasible. They further propose that one way to overcome this speed limitation is to avoid the need to pulse and purge precursors by moving the substrate between zones containing the precursors, passing through intermediate purge zones.

The article discusses that several groups have reported various approaches to accomplishing this, including the approach discussed in the article in which the flexible web is passed between precursor zones in a serpentine pattern. $Al_2O_3$ and $TiO_2$ barrier films 12 to 20 nm thick with water vapor transmission rates in the range of $10^{-4}$ g/m2/day were purportedly demonstrated for web speeds in excess of 1 m/s on 100 mm wide polyethylene terephthalate web. They mention that scale-up of this process to 300 mm wide web in a system capable of depositing 10-20 nm of film in a single pass was under way. The article then discusses this scale-up effort and the potential for very high volume, low-cost moisture barrier production utilizing this technique.

The article entitled "Low-Temperature Roll-to-Roll Atmospheric Atomic Layer Deposition of Al2O3 Thin Films" by Ali et al. published in Langmuir journal on Dec. 2, 2014 discusses that the Al2O3 thin films deposition through conventional ALD systems is a well-established process. They report on the detailed study of low-temperature Al2O3 thin films deposited via a unique in-house built system of roll-to-roll atmospheric atomic layer deposition (R2R-AALD) using a multiple-slit gas source head. The article purports that Al2O3 thin films have been grown on polyethylene terephthalate substrates under a very low-temperature zone of room temperature to 50° C. and working pressure of 750 Torr, which is very near to atmospheric pressure (760 Torr).

The article further states that Al2O3 thin films with superior properties were achieved in the temperature range of the ALD window. An appreciable growth rate of 0.97 Å/cycle was observed for the films deposited at 40° C. The films purportedly had good morphological features with a very low average arithmetic roughness (Ra) of 0.90 nm. The films also showed good chemical, electrical, and optical characteristics. It was observed that the film characteristics improve with the increase in deposition temperature to the range of the ALD window. The article asserts that the fabrication of Al2O3 films was confirmed by X-ray photoelectron spectroscopy (XPS) analysis with the appearance of Al 2 p, Al 2 s, and O 1 s peaks at the binding energies of 74, 119, and 531 eV, respectively.

The article further states that chemical composition was also supported by the Fourier transform infrared spectroscopy (FTIR). The fabricated Al2O3 films demonstrated good insulating properties and optical transmittance of more than 85% in the visible region. Their results state that Al2O3 thin films can be effectively fabricated through the R2R-AALD system at temperatures as low as 40° C.

Despite the prevalence of the above prior art, there is a dearth of techniques for performing efficient R2R plasma enhanced ALD. More specifically and furthermore, there are no techniques in the prior art for performing plasma enhanced/activated ALD or PEALD/PAALD for producing high-throughput, high-quality ALD films with minimal complexity, capital and operational costs. The techniques of the prior art are deficient at least because they either involve exhaust/purging in between precursor injections, or they expose the film to plasma or ion bombardment, or they have separate zones for the web to travel in with damaging contact of the film with rollers/pulleys or other mechanical parts. There are also no teachings in the traditional art for performing plasma activation in an R2R ALD environment using electron cyclotron rotation (ECR)-enhanced hollow cathode plasma sources (HOPS).

OBJECTS OF THE INVENTION

In view of the shortcomings of the prior art, it is an object of the invention to teach techniques for performing low-cost and low-complexity R2R ALD.

It is also an object of the invention to perform R2R ALD either using plasma activation or in the thermal regime.

It is further an object of the invention to use ECR-enhanced HCPSes for plasma activation in a high-throughput and low-cost R2R PEALD/PAALD environment.

It is further an object of the invention to eliminate plasma damage to the ALD films.

It is also an object of the invention to eliminate/reduce mechanical damage to the ALD films.

It is also an object of the invention to eliminate the need of purge cycles during precursor injections.

Still other objects and advantages of the invention will become apparent upon reading the detailed description in conjunction with the drawing figures.

SUMMARY

The objects and advantages of the present technology are secured by methods and apparatus/systems for performing roll-to-roll (R2R) atomic layer deposition (ALD). The R2R ALD may be performed either as plasma enhanced/activated ALD (PEALD/PAALD) with or without the assistance of thermal heating, or solely as thermal ALD operating in the thermal regime.

In order to accomplish the above, a first plurality or rows/slits of nozzles is provided. The purpose of these first set of rows/slits is to continuously flow a reactant/precursor A of constituent gas(es) into an R2R ALD chamber. Similarly, a second plurality or rows/slits of nozzles is provided with the purpose of continuously flowing a second reactant/precursor B of constituent gas(es) in the R2R ALD chamber. There is a flexible web that moves or is transported at a constant speed unrolling/unwinding from one roll/roller at one end of the chamber and rolling onto or winding on/onto another roll/roller at the other distal end of the chamber.

The above slits/rows of nozzles for flowing/injecting precursors A and B are organized in A/B pairs of nozzles of precursors A/B respectively. Furthermore, the A/B pairs are arranged in linear rows in a direction perpendicular to the R2R motion of the flexible web/substrate described above. There is also advantageously a heat source, which is preferably comprised of Infra-red (IR) lamps or heating elements that exist underneath the moving web.

In the PEALD/PAALD embodiments of the present design, each nozzle of slits/rows B of nozzles comprises an electron cyclotron resonance/rotation (ECR)-enhanced hollow cathode plasma source (HCPS). The ECR-enhanced HCPSes produce stable and low-pressure plasma of precursor B in each nozzle of slit/row B. In order to prevent the plasma ions and electrons from coming in contact with the substrate and damaging its surface, a ceramic plug with a pinhole is innovatively provided. This ceramic plug with pinhole is placed underneath each nozzle of slit/row B. The ceramic plug stops the damaging plasma from entering the ALD/process volume while its central pinhole only allows the excited/activated neutrals of precursor B to pass into the ALD volume.

Because of the instant continuous-flow design, precursor A and B are thus continuously flown through the rows/slits A and B respectively. Another way to state this is that precursor A/B are continuously flown via A/B pairs of rows/slits of nozzles/HCPSes A/B into the ALD volume.

As the flexible web of substrate moves underneath slits/rows A of nozzles of an A/B pair, nucleates from precursor A are deposited onto the reactive sites of the substrate. The substrate with the deposited nucleates of precursor A then moves underneath the slits/rows B injecting/flowing activated neutrals of precursor B per above. As a result, a self-limiting ALD reaction between nucleates A, neutrals B and the surface of the substrate takes place that consumes/saturates the reactive sites of the substrate, thereby depositing a uniform-thickness atomically sized ALD film on it. Each such A/B pair can thus be used/activated/utilized to deposit a single ALD film on the substrate. Thus, in a single pass of the web, multiple high-quality ALD films may be deposited by activating multiple A/B pairs. In cases where only fractional layers need to be deposited, only the desired fraction of the A/B pairs need to be activated.

The above-discussed self-limiting ALD reaction may be further enhanced by heating the flexible web by the heat source discussed above. However, in thermal embodiments of the present design that operate purely in the thermal regime, the plasma source(s) may not be present or may be turned off. In such thermal embodiments, the ALD reaction is facilitated purely by the heat supplied by the heat source underneath the moving flexible web. One application of such thermal embodiments is to support certain chemistries of ALD reaction that are conducive to low temperatures, without needing plasma activation.

Because of the configuration and the geometry of the instant design, the ALD film is preferably deposited across the entire width of the flexible web. This results in maximum utilization of the substrate and precursor materials (coaters). Furthermore, because of the continuous-flow design and operation of the system, no purge cycles are needed during a pass of the web, or in between precursor injections. This greatly reduces complexity because expensive evacuation ports in between precursor rows/slits are not required. In contrast, only one evacuation pump underneath the flexible web is required, preferably at an end of the chamber near the roll/roller onto which the flexible web is being wound after film deposition. The evacuation pump is used to evacuate or pump out any unused or unreacted reactants/precursors from the chamber.

As a result of the saturation or consumption of the reactive sites of the substrate due to the above-discussed self-limiting ALD reaction, the precursors do no "stick" to the substrate and are easily pumped out. The above R2R PEALD/PAALD techniques may be used to deposit a variety of ALD films, including nitrides and oxides, such as AlN, Al2O3, GaN, Ga2O3, SiO2, Si3N4, ZnO, Zn3N2, HfO2, etc.

Preferably, the pressure inside the R2R ALD chamber is in the range of 0.1 Torr to 0.5 Torr. Preferably, the temperature of the flexible web substrate is in the range of 20° C. to 300° C. Preferably, the distance between the exits of A/B nozzles and the web is in the range of 1 to 2 inches. Preferably, the distance/spacing between A/B rows/slits of nozzles of each A/B pair is greater than 2 inches. Preferably, the distance/spacing between consecutive individual nozzles of each row/slit on an A/B pair is in the range of 0.5 inch to 1 inch. This distance depends on factors including the distance of the nozzles from the web and can be adjusted to meet the requirements of a specific implementation of the technology. This is because the cone-shaped spread of the precursors should cover the entire width of the web.

Each above-mentioned ECR-enhanced HCPS comprises an axially magnetized cylindrical magnet placed around the neck of a hollow cathode or cavity. The hollow cathode or cavity is placed under the influence of a radio frequency electromagnetic field, or simply an RF field. As precursor B is flown through the neck of the cavity and into the cavity, under the influence of the RF field it undergoes a state transition to a plasma state or simply plasma. The plasma consists of free electrons and gas ions. Because of the cylindrical magnet, the free electrons thus generated remain confined to a narrow spiraling beam as they travel downward through the body of the hollow cathode/cavity.

This is due to the magnetic field of the cylindrical magnet placed around the neck or the top portion of the cavity where the plasma is struck. More specifically, it is due to the familiar phenomenon of electron cyclotron rotation (ECR). In other words, as a result of the ECR caused by the magnetic field of the magnet, the electrons spiral down the hollow cathode, instead of undergoing a wild, zig-zag motion or the "pendulum effect". Subsequently, the high-density and uniform plasma is produced or outputted or is available at the bottom or far or distal end of the hollow cathode or cavity. However, per above teachings, the plasma of precursor B thus generated is stopped/prevented from entering the ALD volume by the ceramic plug, that only allows the activated neutrals of precursor B to pass through its pinhole.

The instant multicavity design of an R2R reactor or chamber consists of such HCPSes arranged in linear rows/slits B of A/B pairs per above discussion. Cylindrical, axial magnets around the tops/necks of the cavities are all aligned or oriented in the same direction. Preferably, the frequency of the RF field around HCPS cavities is substantially 13.56 Megahertz to be compatible with commercial technologies. Preferably, the magnets are cooled using an arrangement of a thermally conductive ceramic plate, a cooling plate and an inflow/outflow of cooling water.

Clearly, the system and methods of the invention find many advantageous embodiments. The details of the invention, including its preferred embodiments, are presented in the below detailed description with reference to the appended drawing figures.

DETAILED DESCRIPTION

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable, similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 1:
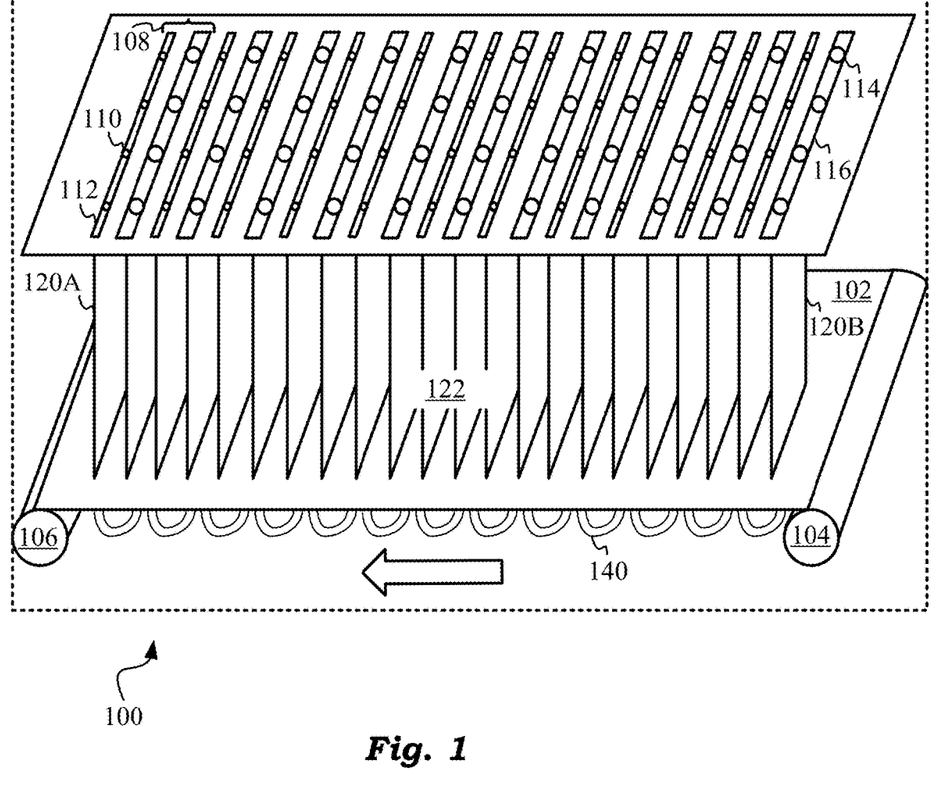
FIG. 1 shows a schematic diagram of a roll-to-roll (R2R) plasma enhanced/activated atomic layer deposition (PEALD/PAALD) vacuum deposition chamber according to the instant principles.

The present invention will be best understood by first reviewing the schematic diagram of a roll-to-roll (R2R) vacuum deposition chamber and more specifically an R2R plasma enhanced/activated atomic layer deposition (PEALD/PAALD) chamber 100 as schematically depicted in FIG. 1. FIG. 1 shows in a schematic form a roll-to-roll PEALD/PAALD or simply an ALD chamber 100 based on the present principles. More specifically, the diagram shows a flexible web 102 consisting typically of a semiconductor substrate that moves at a uniform speed from a roll 104 to a roll 106 as shown by the direction of the block arrow. Flexible web 102 is unrolled or unwound from roll 104 and rolled or wound onto roll 106 at a constant speed in what is referred to a roll-to-roll or R2R motion.

According to the chief aspects, there are a plurality of nozzles 110 and nozzles 114 that are arranged linearly in rows or slits 112 and 116 respectively as shown. Consequently, nozzles 110 and 114 are arranged in linear rows/slits 112 and 116 respectively in one or more pairs. These rows/slits are in a direction perpendicular to the R2R motion of flexible web 102. One such pair of rows of nozzles 110 and 114, also referred to as an A/B pair, is shown marked by bracket/brace 108 in FIG. 1. Each A/B pair of rows/slits 112/116 consists of a plurality of nozzles 110/114 respectively. Only one of plurality of nozzles 110, one of plurality of nozzles 114 and one pair amongst pairs 108 of rows of nozzles 110 and 114 is shown marked in FIG. 1 in order to avoid clutter.

As flexible web or substrate 102 of a semiconductor material, such as silicon, is passed from roll 104 to 106 in the R2R apparatus 100 of FIG. 1, a precursor or reactant A comprising one or more constituent gases, is continuously flown through nozzles 110 from above and onto flexible substrate/web 102. Similarly, as will explained further below, the excited/activated neutrals of another precursor or reactant B comprising one or more constituent gases, are continuously flown through nozzles 114 and onto flexible substrate/web 102.

These reactant gases then react on the surface of flexible web 102 in a self-limiting manner of an ALD reaction and as per the teachings of U.S. Pat. No. 11,087,959 issued on Aug. 10, 2021 entitled "Techniques for a hybrid design for efficient and economical plasma enhanced atomic layer deposition (PEALD) and plasma enhanced chemical vapor deposition (PECVD)" and which is incorporated by reference for all purposes in its entirety. The result is the deposition of a uniform atomically sized ALD layer by each A/B pair 108 of nozzles 110 and 114 on web 102 as it rolls from roller 104 to roller 106 underneath the nozzles.

Explained further, reactant gases from each A/B pair 108 of nozzles 110 (A nozzles) and 114 (B nozzles), are injected over web 102 in chamber 100. FIG. 1 explicitly shows reactant A from nozzles 110 marked by reference numeral 120A into ALD or process volume 122 of R2R ALD chamber 100. FIG. 1 also explicitly shows reactant B marked by reference numeral 120B, and more specifically its excited neutrals per below teachings, injected from nozzles 114 into ALD volume 122. According to the instant technology, precursor A and excited/activated neutrals of precursor B react on the surface of web 102 in a self-limiting reaction to form a single atomically sized layer or a single ALD layer on web 102. More specifically, it is the nucleates of precursor A deposited on the substrate that react with the plasma activated neutrals of precursor B to undergo the above-mentioned self-limiting ALD reaction.

In such a manner, as web 102 passes underneath each pair A/B pair 108 of rows of nozzles 112 (A) and 116 (B), a single atomically sized layer is deposited on the web by the A/B pair. The arrangement per the present design thus allows multiple atomically sized ALD layers to be deposited on flexible web 102 by each A/B pair 108 of nozzles 110/114 in a single pass of flexible web 102 in an efficient manner.

According to the present design, the self-limiting reaction of reactant/precursor gases A and B in ALD volume 122 can be facilitated by various means. In the preferred set of embodiments, this is accomplished by injecting only the neutrals of precursor B that have been activated/excited previously in/by a low-pressure plasma of precursor B. This is accomplished by employing an electron cyclotron resonance (as commonly referred to in the industry) or electron cyclotron rotation (ECR)-enhanced hollow cathode plasma source (HCPS) around each of the plurality of B nozzles 114 of A/B pairs 108. The ECR-enhanced HCPS employed for this purpose is according to the teachings provided in U.S. patent application Ser. No. 17/162,828 filed on Jan. 29, 2021 entitled "Electron Cyclotron Rotation (ECR)-Enhanced Hollow Cathode Plasma Source (HCPS)" and which is incorporated by reference for all purposes in its entirety.

The ECR-enhanced HCPS consists of a strong magnet around a hollow cathode that traps the electrons in cyclotron paths and thus enhances the probability of their collisions with the gas molecules. The design allows maintaining stable plasma with ease at low temperatures. More specifically, and while referring to FIG. 4-6 of the above-referenced U.S. patent application Ser. No. 17/162,828, each nozzle 114 comprises an ECR-enhanced HCPS cavity 104D with an output hole 104M. However, in contrast to the multicavity showerhead design of FIG. 4-5 of the above reference, the R2R ALD vacuum deposition chamber of the instant application consists of a linear multicavity design in which ECR-enhanced HCPSes are arranged in linear rows/slits 116 of a plurality of B nozzles 114 arranged in A/B pairs, as per FIG. 1 of the instant application.

The ECR-enhanced HCPS transforms precursor B into a plasma state with excited ions and electrons. Now, in order to prevent this plasma from coming in direct contact with flexible web/substrate 102 and damaging it, another innovative aspect of the present design is employed. More specifically, there is a ceramic plug with at least one pinhole that is placed at the bottom of each ECR-enhanced HCPS nozzle 112 and directly below its output hole 104M. Preferably, there is one pinhole in the center of the plug.

The plug prevents plasma electrons and ions from entering process volume 122 while only allowing excited/activated neutrals of precursor B to pass through its pinhole. As a result of such a design, sensitive ALD processes can be supported in process volume 122 at low temperatures and pressures. The highly excited/activated neutrals of precursor B come in contact with nucleates from precursor A on the surface of flexible web 102 to undergo the above-mentioned self-limiting ALD reaction.

Because the surface of web 102 is protected from direct contact with the damaging plasma contained in HCPS cavities of nozzles 114, high-quality and uniform-thickness ALD layers/films can be produced on the substrate, and in accordance with the teachings of above-incorporated references of U.S. Pat. No. 11,087,959 and U.S. patent application Ser. No. 17/162,828. The self-limiting reaction of precursor A and the activated neutrals of precursor B is further facilitated by heating flexible substrate 102 by a heating element/source 140 as shown in FIG. 1.

Precursor A and neutrals of precursor B are passed into the ALD/process volume 122 in a continuous-flow manner and in accordance with above-incorporated teachings of U.S. Pat. No. 11,087,959. As a result, no separate purge cycles are required between precursor flows, thereby greatly improving the efficiency and reducing the operational cost of the system. The cycle-time of the ALD process is determined by the spacing between rows/slits 112 of precursor nozzles 110 (or simply put, nozzles A) of precursor A, and rows/slits 116 of precursor nozzles/HCPSes 114 (or simply put, nozzles B). The cycle-time further depends on the speed of the uniform R2R motion of flexible web 102. As a result of the present design and above-incorporated teachings, the cycle-time of the ALD process is greatly reduced as compared to the techniques of the prior art.

It is of note that as web 102 moves underneath the stationary alternating rows/slits of precursor nozzles in A/B pairs, the geometry results in effectively exposing the substrate to the reactants in a "pulsed" manner, even though precursors/reactants A/B are flown into the chamber continuously per above. In other words, as web 102 moves underneath each row/slit 112 of A nozzles 110, it is at that moment exposed only to precursor A flowing from that row/slit. The R2R motion of the web thus effectively exposes the substrate to a pulse of precursor A, even though precursor A is flown continuously into chamber 100.

Now, as web 102 moves on and away from underneath row/slit 112 of A nozzles 110 and underneath row/slit 116 of B nozzles 114 flowing neutrals of precursor B (or neutrals B), it is thus exposed only to B neutrals at that moment. Thusly, web 102 is effectively exposed to neutrals B in a pulsed manner, even though precursor B is continuously flown into the cavities of the HCPSes of row/slit 116 as neutrals B are continuously flown into process volume 122.

Figure 2:
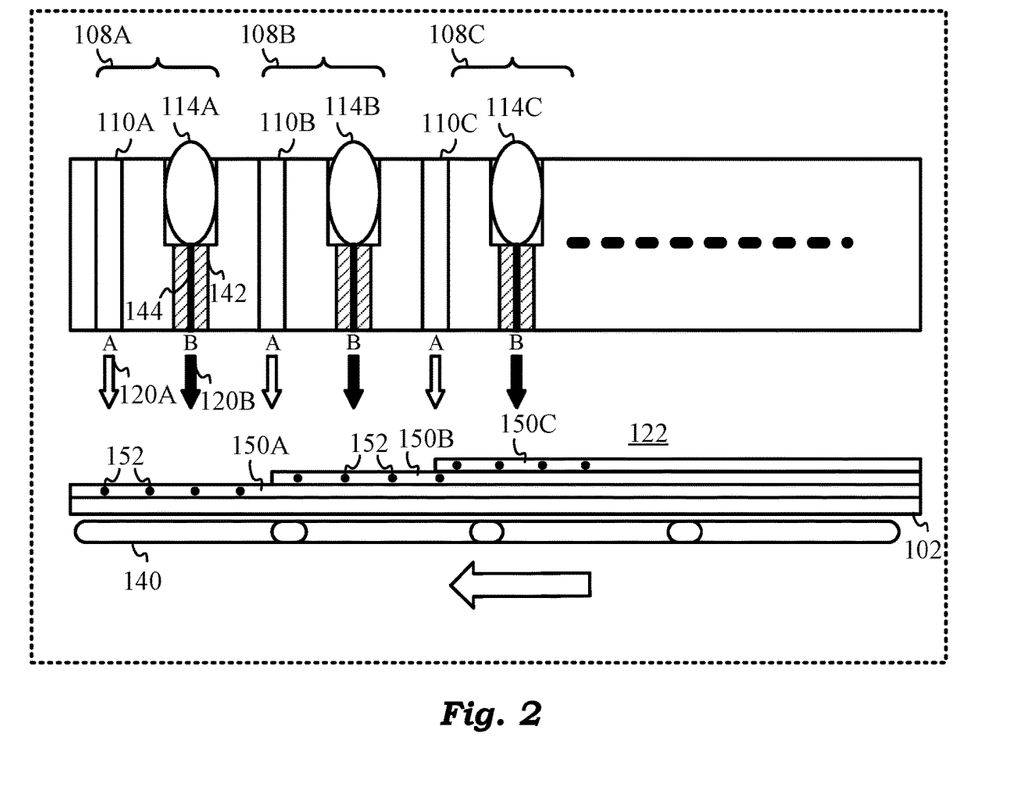
FIG. 2 shows the schematic of a cross-sectional view of the interior of an instant roll-to-roll (R2R) PEALD/PECVD chamber.

In the preferred embodiment, the ALD layers deposited by the present technology include oxide (O2/O3) and/or nitride (N2) layers. Let us now look at FIG. 2 to further understand the present design. FIG. 2 shows the schematic of a cross-sectional view of the interior of an instant roll-to-roll (R2R) PEALD/PECVD chamber. More specifically, FIG. 2 shows a first set or plurality of nozzles 110 from FIG. 1 for injecting a precursor/reactant gas(es) A marked by reference numeral 120A into process or ALD volume 122. There is also a second set or plurality of nozzles 114 each consisting of an ECR-enhanced HCPS per above discussion for injecting the excited neutrals of precursor 120B into the ALD/process volume.

FIG. 2 specifically shows a ceramic plug 142 with the hatched pattern at the bottom of each HCPS and containing a pinhole 144 that prevents damaging plasma from entering process volume 122 while only allowing excited neutrals of precursor B to pass through. Note that for simplicity, we may also refer to the excited neutrals of precursor B, or neutrals B, as simply by precursor B marked by reference numeral 120B. We may do so with the knowledge that ceramic plug 142 with its pinhole 144 will only allow the plasma-activated neutrals of precursor B (neutrals B) to pass through to ALD volume 122.

Now, flexible web of substrate 102 first moves underneath A nozzles in slits/rows 110A of A/B pair 108A that are continuously flowing precursor A into process volume 122. As a result, nucleates 152 of precursor A, or nucleates A, are deposited onto the reactive sites of substrate 102 as shown in FIG. 2. Substrate 102 with deposited nucleates 152, or nucleates A, of precursor 120A then moves underneath B nozzles in slits/rows 114A of A/B pair 108A. B slits/rows 114A are continuously injecting/flowing activated neutrals of precursor 120B, or neutrals B into process volume 122. As a result, a self-reacting ALD reacting between nucleates A, neutrals B and the surface of substrate 102 takes place that consumes/saturates the reactive sites of the substrate. The result is the deposition of a uniform-thickness atomically sized ALD film on substrate 102.

Nucleates 152 of precursor A on the reactive sites of substrate 102 are shown in FIG. 2 coming in contact with the excited neutrals 120B of precursor B to undergo a self-limiting ALD reaction of the above teachings. As a result, an atomically sized, uniform thickness ALD layer or film or coating 150A is deposited on substrate 102. Explained even further, each atomically sized ALD layer/film/coating, such as layer 150A is deposited on flexible web/substrate 102 by a single A/B pair, such as pair 108A, of A nozzles 110A and B nozzles/HCPSes 114A arranged linearly in a direction perpendicular to the motion of substrate 102. Recall that FIG. 2 shows a cross-sectional view of our R2R PEALD/PAALD apparatus. Hence, there are multiple such nozzles 110A and 114A arranged in linear rows going into the page of the two-dimensional view of FIG. 2.

In a similar manner as ALD layer 150A, A/B pair 108B of nozzles 110B/114B deposits layer/film/coating 150B on top of layer 150A, and A/B pair 108C of nozzles 110C/114C deposits layer 150C on top of layer 150B and so on. As a consequence of the present design, any number of such high-quality ALD layers/films 150 may be efficiently deposited on moving web 102 in a cost-effective manner. The dashed line shown in FIG. 2 indicates that any number of such A/B pairs may be present to deposit respective number of layers/films 150.

Furthermore, as a result of the above-incorporated teachings of U.S. Pat. No. 11,087,959, no purge cycles in between precursor injections are needed. Also, as per the above-incorporated teachings, once reactive sites on substrate 102 are saturated, the reaction automatically stops in a self-limited way, thereby leaving a uniform film on the substrate. Hence, precursor A and neutrals B do not "stick" to the surface of substrate 102 after the reaction is complete and the reactive sites on the surface have been consumed or saturated.

As a consequence, the exhaust or evacuation pump required to purge the gases from the chamber only need to be provided below at one end of the moving flexible web near the roll or roller or spool where it is being wound, as opposed to in between each row/slit 112/116 of precursor nozzles A and B. This greatly simplifies the design and reduces the capital cost of manufacturing of the present technology as well as the operational cost of producing high-quality ALD films. The evacuation pump is continuously run and pumps out or evacuates any unused quantities of the reactants from the chamber. In this manner, there is a continuous or steady-state in-flow of the precursors and out-flow of unused quantities of the precursors. These unused quantities include unactivated neutrals of precursors A and B as well as the activated neutrals of precursor B injected by the HCPSes per above.

FIG. 1 and FIG. 2 also show heating element/source 140 that is preferably one or more Infra-red (IR) heating elements. Heating element/source/heater 140 is used to heat moving flexible web 102 to further facilitate the self-limiting ALD reaction of precursors A and B. However, in another set of preferred embodiments of the present technology, HCPS plasma sources 114 are turned off or do not exist, and the self-limiting reaction of precursor/reactant gases A and B is facilitated solely by heating of flexible web 140. Such an embodiment may be used to perform ALD deposition at higher temperatures than would otherwise be desirable when activation/excitation of precursor B is performed by plasma, as in the prior embodiments. Thus, the geometry of the present design affords the flexibility of performing low-pressure and low-temperature R2R PEALD/PAALD as well as R2R thermal ALD.

Figure 3:
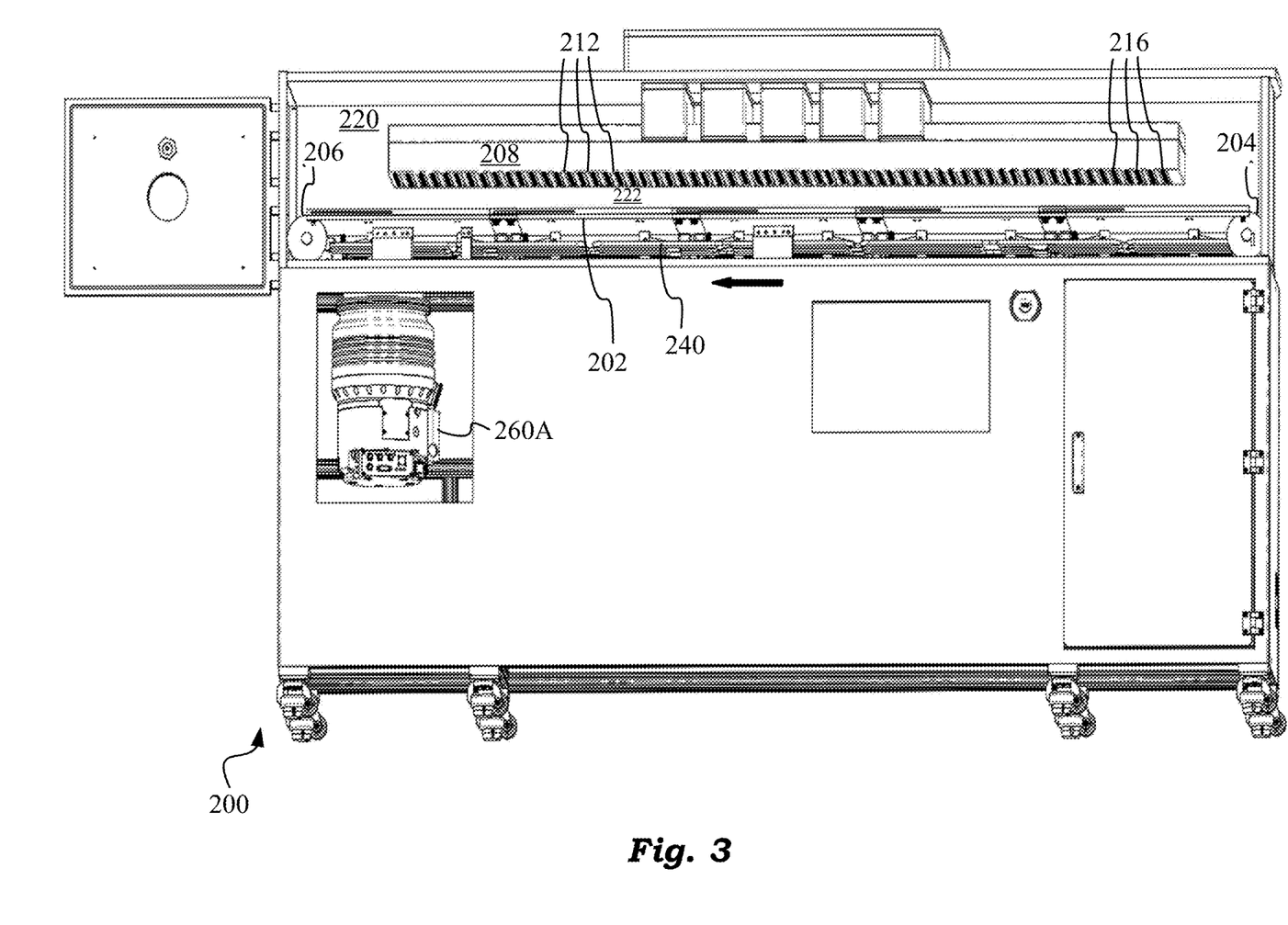
FIG. 3 shows a view of a complete roll-to-roll ALD system 200 based on the instant principles.

FIG. 3 shows a complete roll-to-roll ALD system 200 in greater detail based on the instant principles. More specifically, R2R ALD system 200 has an ALD chamber 220 with R2R substrate rolls or platens 204 and 206 for unrolling from and rolling onto respectively, flexible web 202 in the direction of the solid arrow shown. As flexible web 202 moves at a uniform speed from/to rolls 204/206, multiple ALD layers are deposited on the surface of substrate 202 per above teachings.

FIG. 3 shows A/B pairs 208 of alternating rows/slits or slit arrays 212 and 216 of nozzles A and B for injecting precursor/reactant A and activated neutrals of precursor/reactant B respectively into chamber 220, and specifically its process/ALD volume 222. It is the process/ALD volume in which self-limiting ALD reaction on the surface of web 202 takes place per above teachings. Only three individual rows/slits 212 and three individual rows/slits 216 are shown marked in FIG. 3 in order to avoid clutter.

Slit array or row 212 consists of individual nozzles A for continuously injecting precursor A into process/ALD volume 222 of chamber 220. Nozzles A are not explicitly shown in FIG. 3 for reasons of clarity. Similarly, slit array or row 216 consists of ECR-enhanced HCPS sources B for activating precursor B and then flowing its activated neutrals through respective ceramic blocks with pinholes into process/ALD volume 222. Individual ECR-enhanced HCPS sources B are not explicitly shown in FIG. 3 for reasons of clarity.

There is/are also IR heaters/lamps 240 for heating moving web 202 in order to further facilitate above-discussed self-limiting ALD reaction. In a manner similar to prior thermal embodiments, IR heater(s) 240 are also used solely to facilitate the ALD reaction in thermal embodiments operating in the thermal regime. In a pure thermal regime, there is/are no plasma source(s), such as ECR-enhanced HCPSes, and if present, they are turned off. There is also a turbo pump 260A underneath one (left) end of flexible web 202 as shown in the cut-out portion of apparatus 200. Turbo pump 260A continuously evacuates/pumps out any unused/unreacted quantities of the reactants/precursors from the chamber. These pumped out quantities include unactivated and unreacted neutrals of precursors A and B as well as the unreacted and activated neutrals of precursor B.

As per the teachings of the above-incorporated reference of U.S. application Ser. No. 17/162,828, each of the ECR-enhanced HCPSes of nozzles 114 of FIG. 1-2 and of slits/rows 216 of FIG. 3 comprise of an axially magnetized cylindrical magnet placed around the neck of a hollow cathode or cavity. The hollow cathode or cavity is under the influence of a radio frequency electromagnetic field, or simply an RF field. As precursor B is flown through the neck of the cavity and into the cavity, under the influence of the RF field it undergoes a state transition to a plasma state or simply plasma. The plasma consists of a free electrons and gas ions. Because of the cylindrical magnet, the free electrons thus generated remain confined to a narrow spiraling beam as they travel downward through the body of the hollow cathode/cavity.

This is due to the magnetic field of the cylindrical magnet placed around the neck or the top portion of the cavity where the plasma is struck. More specifically, it is due to the familiar phenomenon of electron cyclotron rotation (ECR). In other words, as a result of the ECR caused by the magnetic field of the magnet, the electrons spiral down the hollow cathode, instead of undergoing a wild, zig-zag motion or the "pendulum effect" of the techniques of the prior art. Subsequently, the high-density and uniform plasma is produced or outputted or is available at the bottom or far or distal end of the hollow cathode or cavity. Per above teachings, the plasma of precursor B is now stopped/prevented from entering the ALD volume by ceramic plug 142 of FIG. 2, which only allows the activated neutrals of precursor B to pass through its pinhole 144.

The instant R2R chamber, such as chamber 220 of FIG. 3, utilizes a multicavity design of the above HCPSes arranged in linear rows/slits 216 per above discussion. Cylindrical, axial magnets around the tops/necks of all the cavities are all aligned or oriented in the same direction i.e. all North poles facing up and all South poles facing down or vice versa. The frequency of the RF field around HCPS cavities is preferably substantially 13.56 Megahertz in order to be compatible with commercial technologies.

The magnets of HCPSes are preferably cooled using an arrangement of a thermally conductive ceramic plate, a cooling plate and an inflow/outflow of cooling water per the teachings of the above-incorporated reference, and which are not repeated here for the sake of brevity. In contrast to the above reference however, the cooling system of an instant R2R ALD apparatus, such as chamber 220 of FIG. 3, is organized/arranged to support its linear design.

Per above discussion, because precursors A and B are flown in a continuous-flow manner in the present design, gases only need to be purged after one or more complete passes of the flexible web. Thus, because purge cycles do not need to occur during the reactions and because such purge cycles do not need to be performed frequently by turbo pumps arranged in between or around the precursor nozzles, the design of FIG. 3 greatly reduces the capital and operational costs of the system over traditional art. This is at least because fewer evacuation pumps and in simpler mechanical arrangements are needed by the geometry of the instant design.

The instant design also enables a highly efficient or high-throughput operation for producing multi-layer ALD films on the flexible web in a reliable manner. Furthermore, the instant design reduces the number of pulleys or mechanical parts that would otherwise be needed to perform a traditional R2R operation. Such traditional prior art systems involve multiple regions or zones for the substrate to pass through and come in physical/mechanical contact with several pullies/rollers, whereas the instant design has no such requirement.

In other words, R2R ALD systems 100 and 200 of FIG. 1-3 have a single chamber or ALD volume with a single zone for depositing multiple ALD layers on the flexible substrate in a single pass.

Exemplarily, if all N A/B pairs 108/208 of FIG. 1-2/FIG. 3 of the precursor nozzles are activated or utilized in one pass of substrate 102/202, then this would result in depositing N ALD layers on the substrate in the one pass. Then the web may be rolled into the chamber again for a second pass to deposit another N layers, and so on. Moreover, if a fraction of the N layers (or fractional layers) needs to be deposited, then only the desired fraction of the N A/B pairs 108/208 need to be activated and utilized for the fractional pass.

The single zone/region design of an instant R2R ALD chamber reduces the cost as well as mechanical damage to the web and ALD films, in contrast to excessive contact of the web with pulleys and other mechanical parts as in traditional art. As already noted, the present design also reduces/eliminates plasma damage to the web substrate, thereby affording further improvements of the quality of ALD films/layers and reduction of the cost of operation of the system. Furthermore, because of the arrangement of precursor nozzles in linear A slits/rows 112/212 and B slits/rows 116/216 in A/B pairs of FIG. 1-3, the reactants cover the entire width of the substrate underneath. This results in an increased coverage of substrate 102/202 with the ALD layer(s) and an improvement in the eventual yield/output of the system. Further as a consequence of this aspect, any arbitrary width of the web can be coated/layered.

Figure 4:
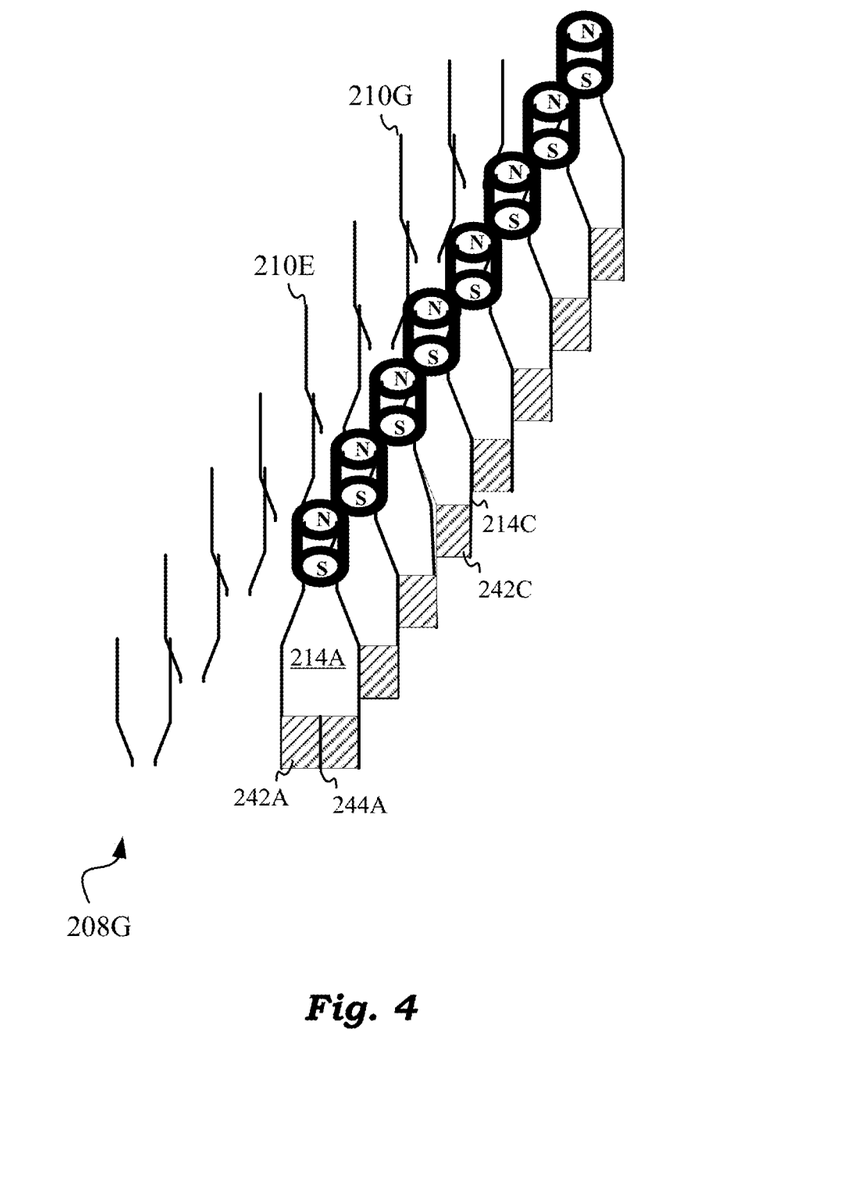
FIG. 4 shows a perspective view of an A/B pair from the embodiment of FIG. 3 in greater detail.

For completeness, FIG. 4 shows a perspective view of an A/B pair in greater detail. More specifically, FIG. 4 shows an A/B pair 208G from the embodiment of FIG. 3, consisting of two respective rows 210/214 of A/B nozzles respectively of the above discussion. A/B pair 208G consists of a number of A nozzles that flow precursor A into ALD volume 222. Of these nozzles, two nozzles 210E and 210G are individually marked in FIG. 4 by reference numerals as shown. Similarly, A/B pair 208G also shows B nozzles comprising ECR-enhanced HCPSes for flowing excited neutrals of precursor B into the ALD volume per above discussion.

HCPSes 214 are shown aligned in FIG. 4 with the North magnetic poles of all magnets facing upwards and the South magnetic poles of all magnets facing downwards. Also shown are ceramic plugs or ceramic plug inserts 242 with pinholes 244 that are inserted into respective HSPSes 214. Of these HCPSes and ceramic plugs, two HCPSes 214A and 214C, with respective ceramic plugs 242A and 242C are individually marked by reference numerals as shown. Pinhole 244A of plug 242A is visible and marked in FIG. 4 while the rest of the pinholes of ceramic plugs are hidden in the perspective view of FIG. 4, but are presumed to exist. The rest of the components cooperating with the HCPSes, including a cooling mechanism, such as the one mentioned above and taught in the above-incorporated reference, are presumed to exist but not explicitly shown in FIG. 4 in order to avoid detraction.

The above R2R PEALD/PAALD techniques may be used to deposit a variety of ALD films, including nitrides and oxides, such as AlN, Al2O3, GaN, Ga2O3, SiO2, Si3N4, ZnO, Zn3N2, HfO2, etc. Based on the above teachings, let us now summarize the key advantages of the instant R2R ALD vacuum deposition system over the techniques of the prior art. These include at least:

1. Minimal or no plasma damage to PEALD/PAALD layers/films.
2. N layers deposited in a single pass of the flexible web.
3. Minimal or no contact of pulleys with the web, thus minimal mechanical damage to the layers/films.
4. ECR-enhanced HCPS for precursor B results in a wider process window and more activated reactant B. Further no exhaust/purge operation is needed between precursors per above teachings. The design can thus support faster web speeds and increased throughput.
5. Reduced ALD cycle-time, again since no exhaust/purge between precursor injection is needed.
6. The instant geometry allows for heating of the substrate to further enhance PEALD/PAALD.
7. The geometry/design also allows supporting thermal only embodiments. Depending on the chemistry of the reactions involved, the thermal ALD may be performed at low or at room temperatures.
8. Does not require evacuation ports/pumps between precursor nozzles since once the surface of the substrate is saturated, additional precursor does not stick to the surface. Pumping is performed only at one end of the web where it is being rolled up/onto after deposition per above teachings, thereby greatly reducing cost. For the same length/amount of the coater material, twice the number of ALD layers can be deposited in a single pass as compared to the techniques of the prior art.
9. Supports depositing fractional layers, that is, the number of layers deposited can be a fraction of the number of A/B pairs of precursor nozzles.

The following is a list of operational parameters from an exemplary implementation of the present technology. More specifically, the following lists the parameters of an exemplary roll-to-roll (R2R) plasma enhanced/activated atomic layer deposition (PEALD/PAALD) vacuum deposition system/reactor based on the instant principles:

1. Chamber pressure range: 0.1 Torr to 0.5 Torr.
   Preferably, this is the range of pressure inside chamber 220 of FIG. 3.
2. Substrate temperature range: 20° C. to 300° C.
   Preferably, this is the range of temperature of flexible web 102 and 202 of FIG. 1-3.
3. Distance between the lower ends of A/B pairs and the flexible web: 1 inch to 2 inches.
   Preferably, this is the distance between the lower ends of nozzles 110/114 and flexible web 102 of FIG. 1-2, and between the lower ends of rows/slits 212 and 216 and web 202 of FIG. 3.
4. Spacing between A and B precursor rows/slits: Greater than 2 inches.
   Preferably, this is the distance between rows/slits 112 and 116 of each A/B pair 108 of FIG. 1-2, and between rows/slits 212 and 216 of each A/B pair 208 of FIG. 3.
5. Spacing between individual nozzles of rows/slits of precursor nozzles A/B: 0.5 inch to 1 inch.
   Preferably, this is the distance between individual nozzles 110 and 114 of rows/slits 112 and 116 respectively of FIG. 1-2, and between individual nozzles of rows/slits 212 and 216 of FIG. 3.
6. Diameter of the pinholes in the ceramic plugs under ECR-enhanced HCPSes: 20 mills to 40 mills, where 1 mill is 1/1000 of an inch.
   Preferably, this is the diameter of pinholes 144/244 of respective ceramic plugs 142/242 shown explicitly in FIG. 2/FIG. 4 respectively.
7. Length of the pinholes in the ceramic plugs under ECR-enhanced HCPSes: 0.2 inches to 0.4 inches.
   Preferably, this is the length of pinholes 144/244 of respective ceramic plugs 142/242 shown explicitly in FIG. 2/FIG. 4 respectively.

It is once again noted that the above measurements/parameters are from an exemplary practical implementation of the present principles only. Variations of above measurements/parameters are easily conceivable within the scope of the present principles in order to support the needs of a specific implementation. Furthermore, there is interdependence within the above parameters in order to realize a given practical implementation. For example, it has been observed that the distance in (5) above should be approximately half the distance in (3) above.

In view of the above teaching, a person skilled in the art will recognize that the apparatus and methods of invention can be embodied in many different ways in addition to those described without departing from the principles of the invention. Therefore, the scope of the invention should be judged in view of the appended claims and their legal equivalents.

What is claimed is:

1. A method comprising the steps of:
    (a) continuously flowing a precursor A and activated neutrals of a precursor B from a first plurality of nozzles and a second plurality of nozzles respectively into a roll-to-roll (R2R) atomic layer deposition (ALD) chamber, wherein said first plurality of nozzles and said second plurality of nozzles are arranged linearly in one or more A/B pairs in a direction perpendicular to a roll-to-roll motion of a flexible web occurring at a constant speed underneath said A/B pairs, wherein said second plurality of nozzles comprise a respective plurality of electron cyclotron resonance (ECR)-enhanced hollow cathode plasma sources (HCPSes) for producing a plasma of said precursor B, and wherein said respective plurality of ECR-enhanced HCPSes comprise a corresponding plurality of cylindrical and aligned magnets around a corresponding plurality of hollow cathodes;
    (b) placing a ceramic plug containing a pinhole underneath each of said second plurality of nozzles to allow activated neutrals of said precursor B to flow into said R2R ALD chamber while preventing said plasma from flowing into said R2R ALD chamber and from coming in contact with said flexible web; and
    (c) depositing one or more uniform atomically sized ALD layers on a surface of said flexible web as a result of a self-limiting reaction on said surface between nucleates from said precursor A and said activated neutrals of precursor B, and wherein said self-limiting reaction consists only of an ALD reaction, and without requiring intervening purge and exhaust operations, and without requiring complete consumption of precursor A, and wherein:
    (d) a distance between the lower ends of said first plurality and said second plurality of nozzles and said flexible web is substantially in the range of 1 inch to 2 inches;
    (e) a spacing between each of said first plurality of nozzles is substantially in the range of 0.5 inch to 1 inch;
    (f) a spacing between each of said second plurality of nozzles is substantially in the range of 0.5 inch to 1 inch; and
    (g) a spacing between said first plurality of nozzles and said second plurality of nozzles is greater than 2 inches.

2. The method of claim 1 depositing said one or more uniform atomically sized ALD layers across an entire width of said flexible web.

3. The method of claim 1 utilizing a heating element to heat said flexible web for further facilitating said self-limiting reaction.

4. The method of claim 1 providing a temperature of said flexible web to be substantially in the range of 20° C. to 300° C.

5. The method of claim 1 utilizing one A/B pair amongst said one or more A/B pairs to deposit one of said one or more uniform atomically sized ALD layers in a single pass of said flexible web.

6. The method of claim 1 further providing an evacuation port in said R2R ALD chamber underneath a roll which said flexible web is wound onto, said evacuation port used for pumping out unreacted quantities of said precursor A and said precursor B.

7. The method of claim 6 preventing said precursor A and said activated neutrals of said precursor B from sticking to said surface once said surface is saturated by said self-limiting reaction.

8. The method of claim 1 providing a diameter of said pinhole in said ceramic plug to be substantially in the range of 20 mills to 40 mills.

9. The method of claim 1, providing an inside pressure of said R2R ALD chamber to be substantially in the range of 0.1 Torr to 0.5 Torr.

10. The method of claim 1 providing said one more uniform atomically sized ALD layers to include one or both of an oxide layer and a nitride layer.

* * * * *